United States Patent [19]

Reynolds et al.

[11] Patent Number: 4,879,259

[45] Date of Patent: Nov. 7, 1989

[54] RAPID THERMAL ANNEALING OF GALLIUM ARSENIDE WITH TRIMETHYL ARSENIC OVERPRESSURE

[75] Inventors: Scott K. Reynolds, San Mateo County; Dietrich W. Vook, Santa Clara; James F. Gibbons, Santa Clara County, all of Calif.

[73] Assignee: The Board of Trustees of the Leland Stanford Junion University, Stanford, Calif.

[21] Appl. No.: 306,268

[22] Filed: Feb. 1, 1989

Related U.S. Application Data

[63] Continuation of Ser. No. 101,462, Sep. 28, 1987, abandoned.

[51] Int. Cl.[4] .......................................... H01L 21/383
[52] U.S. Cl. ............................ 437/247; 437/174; 437/949; 437/22; 437/942; 148/DIG. 4; 148/DIG. 22; 148/DIG. 84; 357/91
[58] Field of Search ............... 437/247, 174, 939, 949, 437/942, 436; 148/DIG. 4, DIG. 22, DIG. 71, DIG. 84, DIG. 127; 357/60, 91

[56] References Cited

U.S. PATENT DOCUMENTS

| | | | |
|---|---|---|---|
| 4,472,206 | 9/1984 | Hodgson et al. | 437/22 |
| 4,568,397 | 2/1986 | Hoke et al. | 437/942 |
| 4,661,177 | 4/1987 | Powell | 148/189 |

FOREIGN PATENT DOCUMENTS 0112720 9/1981 Japan .
0120330 7/1982 Japan .

OTHER PUBLICATIONS

Kasahara et al, "Capless Anneal of Ion-Implanted GaAs in Controlled Arsenic Vapor", J. Appl. Phys. 50 (1), Jan. 1979, pp. 541-543.
Greiner et al, "Diffusion of Silicon in Gallium Arsenide Using Rapid Thermal Processing: Experiment and Model", Appl. Phys. Lett. 44(8), Apr. 15, 1984, pp. 750-752.
Ito et al., "Radiation Annealing of Si- and S-Implanted GaAs", Japanese Journal of Applied Physics, vol. 22, No. 5, May, 1983, pp. L299-L300.
Liu et al, "Rapid Capless Annealing of Si, Zn, and Be Implants to GaAs", Journal of Electronics Materials, vol. 13, No. 6, 1984, pp. 897-911.
Hara et al., "Capless Rapid Thermal Annealing of Silicon Ion Implanted Gallium Arsenide", Japanese Journal of Applied Physics, vol. 26, No. 2, Feb., 1987, pp. L94-L96.

Primary Examiner—Brian E. Hearn
Assistant Examiner—Beverly A. Pawlikowski
Attorney, Agent, or Firm—Flehr, Hohbach, Test, Albritton & Herbert

[57] ABSTRACT

A method of annealing a wafer in a rapid thermal annealer is disclosed. The walls of the chamber are heated more rapidly than is the wafer. In a preferred embodiment, the interior of the graphite walls of the annealer is lined with a molybdenum sheet which is open toward the lamps that heat the chamber. Thus, the walls heat very rapidly to a temperature greater than the condensation point of arsenic, preventing arsenic condensation on the walls. Effective annealing can be achieved at wall temperatures in the range of 500° to 600° C. Prior to the heat ramp up, an arsenic atmosphere, preferably trimethylarsenic (TMAs) at an appropriate overpressure is introduced. This overpressure is maintained both during the heating and cooling cycle. By the use of this method, the exposure time for annealing can be reduced from prior times of as much as 20 minutes to as little as 10 seconds.

9 Claims, 3 Drawing Sheets

RAPID THERMAL ANNEALING OF GALLIUM ARSENIDE WITH TRIMETHYL ARSENIC OVERPRESSURE

This invention was made with Government support under Contract DAAG29-85-K-0237 awarded by the U.S. Army Research Office. The Government has certain rights in this invention.

This is a continuation of application Ser. No. 101,462 filed Sept. 28, 1987 now abandoned.

FIELD OF THE INVENTION

This invention is related to processing of gallium arsenide (Ga/As) wafers, and more particularly to the annealing of implanted Ga/As wafers.

BACKGROUND OF THE INVENTION

The annealing of ion implanted Ga/As has received much study because of its practical importance for field effect transistor (FET) fabrication. The source, drain an channel of an FET are all generally formed by ion implantation. These implants must then be activated by annealing. In the course of annealing these implants, preferential As evaporation from the surface must be avoided. This is normally done either by providing an arsenic overpressure in a hot wall furnace for an extended time (typically about 20 minutes), or with a deposited encapsulant or proximity cap. By proximity capping is meant placing an additional silicon or Ga/As wafer face to face against the sample being annealed to reduce the arsenic evaporation. For practical reasons, none of these methods are entirely satisfactory in a large scale manufacturing environment. Arsenic furnaces involve long thermal exposure, and use large quantities of arsine. Use of deposited encapsulants (such as $Si_3N_4$ or $SiO_2$) or proximity caps stresses the surface of the Ga/As wafer, and tends to cause cracks. Surface deterioration also increases.

SUMMARY OF THE INVENTION

It is therefore an objective of this invention to provide a method of thermal annealing of ion implanted Ga/As.

More specifically, an objective herein is to provide an annealing method which avoids the problems of stressing, cracking and surface deterioration associated with present methods.

Another objective herein is to provide a method of thermal annealing that reduces the thermal exposure of the wafer.

These and other objectives are achieved in a method wherein the wafer is annealed in a rapid thermal annealer which, by definition, is capable of very rapid changes in temperature from the starting temperature of 0° C. to an annealing temperature of as much as 900° C. Past efforts to use the rapid thermal annealer for Ga/As annealing in an As ambient have met with considerable problems because the arsenic tends to condense on the walls of the annealing chamber. Therefore, according to the present method, the walls of the chamber are heated more rapidly than the is wafer. In a preferred embodiment, the interior of the graphite walls of the annealer are lined with a molybdenum sheet which is open toward the lamps that heat the chamber. Thus, the walls heat very rapidly to a temperature greater than the condensation point of arsenic, preventing arsenic condensation on the walls. Effective annealing can be achieved at wall temperatures in the range of 500° to 600° C. Prior to the heat ramp up, an arsenic atmosphere, preferably trimethylarsenic (TMAs) at an appropriate overpressure is introduced. This overpressure is maintained both during the heating and cooling cycle. It has been found that by the use of this method, the exposure time for annealing can be reduced from prior times of as much as 20 minutes to as little as 10 seconds.

It has further been found that the surface morphology of the Ga/As wafer is better preserved by this method than when an encapsulant or proximity cap touches the Ga/As surface.

BRIEF DESCRIPTION OF THE DRAWINGS

Other features and advantages of this invention will become apparent to a person of skill in the art who studies this disclosure wherein.

DESCRIPTION OF A PREFERRED EMBODIMENT

Figure 1:
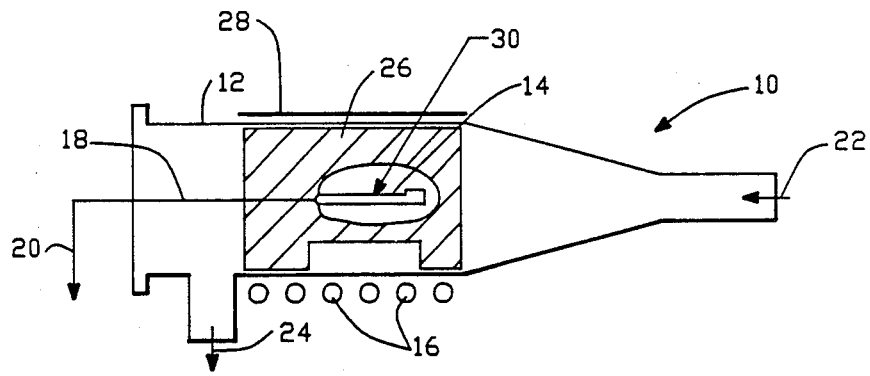
FIG. 1 is a schematic diagram of the rapid thermal annealing chamber used in this invention.

A schematic drawing of an annealing chamber useful for rapid thermal annealing of Ga/As wafers and as modified to implement the process of this invention is shown in FIG. 1. The annealer comprises a quartz chamber 12 having a graphite susceptor 14 for supporting a Ga/As wafer. The chamber 12 is heated by a plurality of quartz halogen lamps 16 which, in this view, are shown below the chamber facing up into the chamber. A thermocouple 18 is provided so that a temperature feedback signal 20 can be derived to monitor the temperature of the wafer. A gas inlet 22 is provided on one side of the chamber 12 for introducing TMAs into the chamber 12. An exhaust 24 is also provided for the flowing TMAs and $H_2$ carrier gas.

The design of the annealer in FIG. 1 has been modified to meet the problem of maintaining an arsenic overpressure in a nominally cold wall reactor. That is, typically, the problem with trying to maintain arsenic overpressure in such a rapid thermal annealer chamber is that the arsenic tends to condense on the walls of the chamber. To avoid this problem, a very thin (2 mil) molybdenum sheet 26, rolled into a semi-cylinder, is inserted inside the quartz tube that is open at the bottom toward the tungsten halogen lamps 16. This sheet 26 is heated at a rate faster than the wafer is heated to a temperature greater than the condensation of the arsenic, preferably to a temperature of 500° to 600° C. To prevent arsenic depletion near the wafer, the sheet reaches its temperature about five seconds after the lamps 16 are switched on. In order to facilitate a fast rise time of the sheet temperature, a reflector 28 is provided outside the graphite chamber which tends to reflect the heat from the halogen lamps toward the rear side of the molybdenum sheet. In the absence of this rapidly heating sheet wall, the arsenic condenses on the quartz walls and reduces the effective arsenic overpressure. The molybdenum sheet is in effect a rapid thermal wall. Although molybdenum is the preferred material in this exemplary embodiment, other materials may be used for this rapid heating effect.

The wafers are supported on a thin graphite susceptor, although in larger scale manufacturing processes, a standard wafer support may be used. A 1/64" diameter stainless steel sheathed thermocouple 18 is inserted in the susceptor 14 for closed loop temperature control.

The quartz halogen lamps 16 provide a temperature rise time at the wafer to its annealing temperature of 800° to 900° C. in about 10 seconds. After the annealing cycle of about 10 seconds, the tube 12 is cooled with a high flow of compressed air switched on at the end of the cycle. The temperature fall time is therefore also on the order of about 10 seconds.

The importance of a rapidly heated thermal wall to maintain the required arsenic overpressure is significant. At a typical annealing temperature of 800° to 900° C., the temperature gradient from the wafer to a normal annealer thermal quartz wall is very steep, enhancing the diffusion of arsenic away from the wafer. In addition, a higher arsenic pressure is needed at 800° to 900° C. to prevent Ga/As surface decomposition. Therefore, the walls have been biased in this method to about 600° C., using the molybdenum sheet to overcome these problems.

Figure 2:
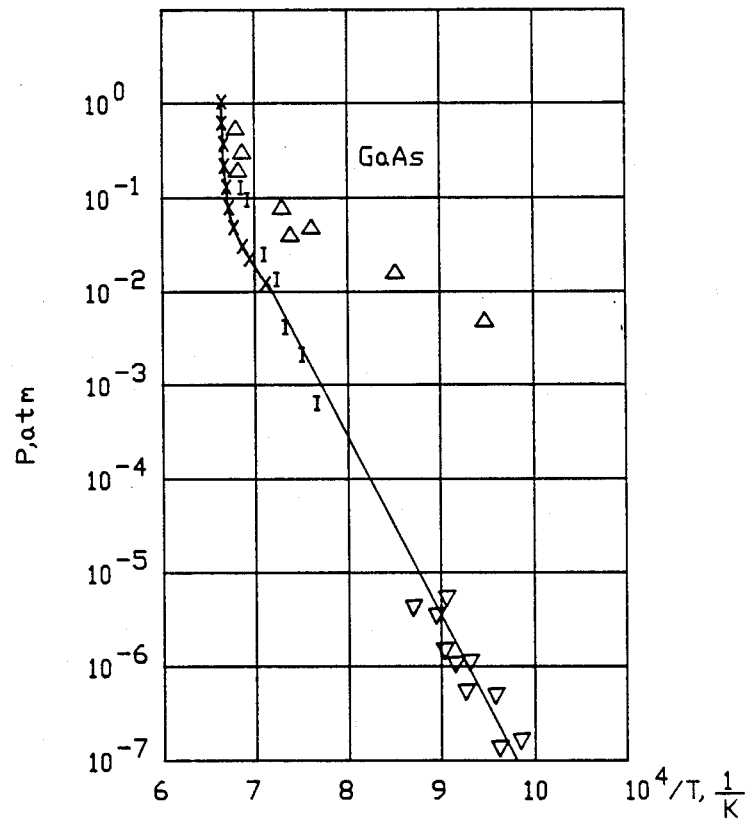
FIG. 2 illustrates the overpressure necessary to avoid arsenic dissociation.

To determine the appropriate arsenic pressure to prevent Ga/As decomposition, reference is made to FIG. 2, which gives the vapor pressure of arsenic over Ga/As as a function of temperature. At 900° C., this is about 0.04 torr. To prevent dissociation, one must therefore provide an arsenic overpressure much greater than this; a factor of 100 is probably suitable.

In a further modification from known methods, arsenic is provided by creating the overpressure with TMAs. TMAs was selected because it is less toxic and easier to handle than arsine. In this annealing application, the additional methyl groups from TMAs do not create any significant disadvantage. Further, this rapid thermal annealer of this invention using the disclosed method is cleaner than an arsine furnace, because TMAs only decomposes while the susceptor is hot. Because in the present method the annealing time is very short, comparatively little arsenic dust is generated. Using TMAs, a partial pressure of 2 torr was found to be adequate to protect the Ga/As surface up to 850° C.; for annealing at higher temperature, a pressure of 4 torr is preferable.

Figure 3:
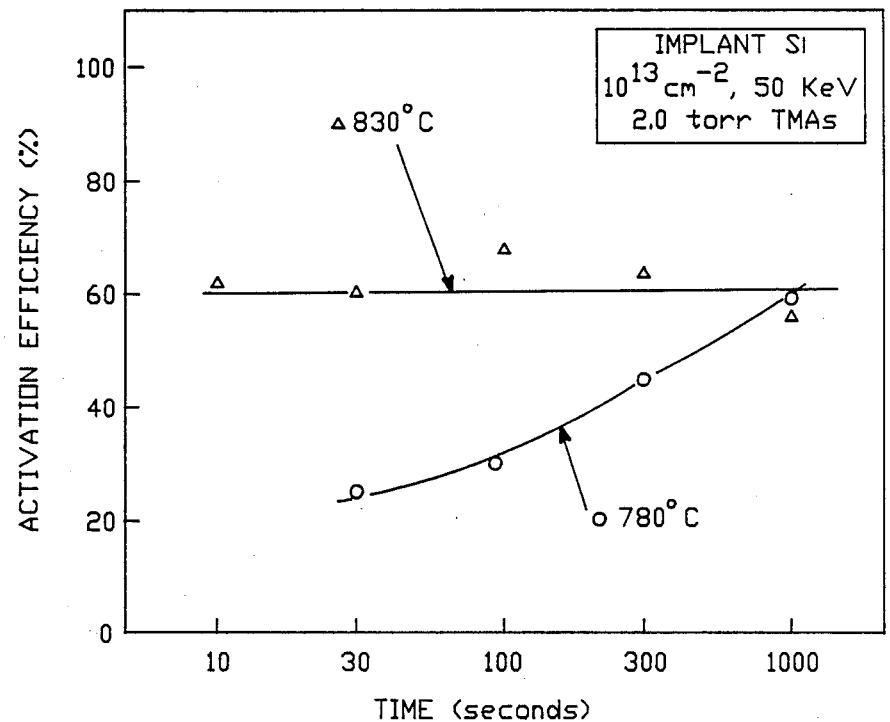
FIG. 3 illustrates activation efficiency versus annealing time for anneals conducted according to the method disclosed herein.

Referring next to FIG. 3, the results indicate the effect of annealing time using the rapid thermal annealer on implant activation efficiency. The activation efficiency was derived using Hall effect measurements in the Van der Pauw configuration to determine the sheet carrier concentration, then dividing this number by the implant dose. For temperatures greater than 830° C., anneal time has little effect on activation. Therefore, it can be seen that a 10 second anneal is just as effective as a much longer one for implant activation. This suggests that significantly shorter annealing times are available using the method of this invention.

Figure 4:
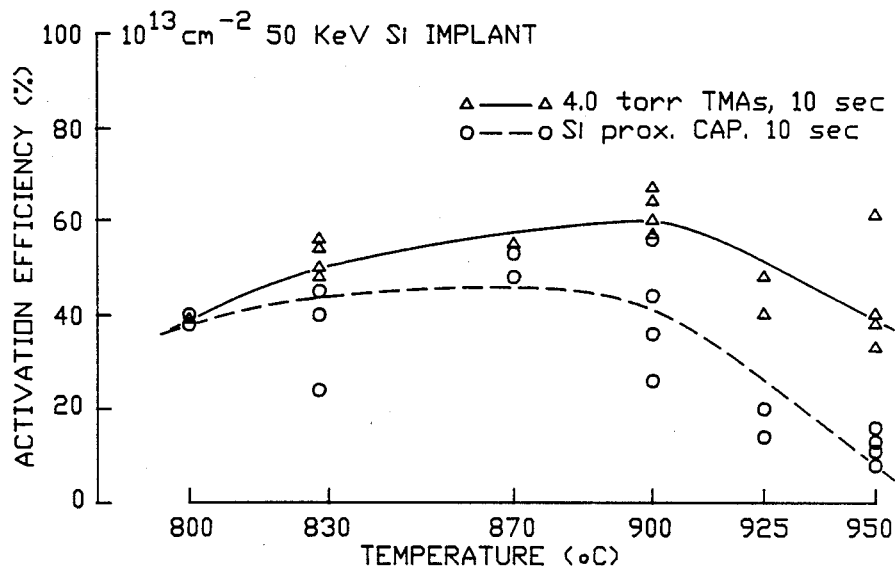
FIG. 4 illustrates activation efficiency versus annealing temperature for 10-second duration anneals, comparing TMAs ambients to Si proximity caps.

Referring to FIG. 4, this FIG. demonstrates the activation efficiency as a function of temperature, for a Si implant dose of $10^{13}$ cm$^{-2}$, comparing the TMAs ambient of this invention to Si proximity caps used in prior art. Other experiments have been carried out using doses ranging from to $10^{13}$ to $10^{15}$ cm$^{-2}$. In almost all cases, the highest activation efficiency was obtained with TMAs overpressure. It can also be seen from FIG. 4 that the improvement afforded by TMAs increases at higher annealing temperatures. In a further benefit of this method, secondary ion mass spectroscopy (SIMS) depth profiling verified that no Si diffusion occurred for 10 second anneals at 900° C. in TMAs or with Si proximity caps. Although results are not shown here, further experiments indicated that higher activation levels were also achieved with TMAs ambient over an unencapsulated wafer than with an $Si_3N_4$ encapsulated wafer annealed in $H_2$ only.

In another benefit herein, the Ga/As surface for anneals using only TMAs overpressure remained featureless for all anneal conditions. In contrast, visible blistering of nitride encapsulation over a wafer was observed for 10 second anneals at 900° C. and above. After removing the nitride, damage to the Ga/As surface of these samples was also observed. Surface damage was occasionally observed even for lower temperature samples which did not blister, although other laboratories have apparently had somewhat better results with nitride encapsulation. However, experiments do appear to indicate that the nitride encapsulation process must be individually optimized. Surfaces protected by Si proximity cap alone without TMAs began showing signs of localized pitting for 10 second anneals at 925° C. The surface degradation was visible by eye for 10 second anneals at 950° C.

Figure 5:
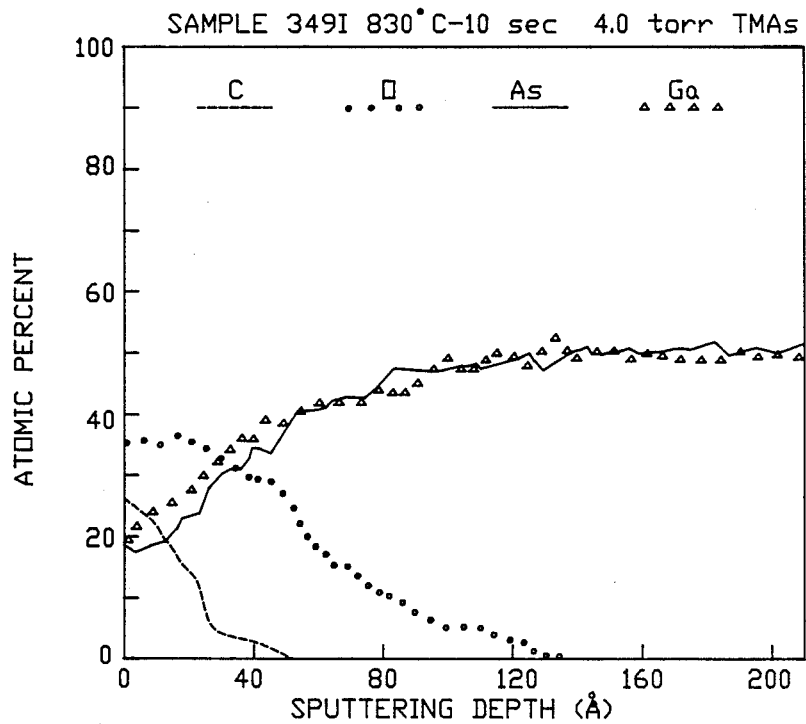
FIG. 5 is an Auger sputtering profile for a sample annealed in TMAs for 10 seconds at 830° C.

Thus, TMAs overpressure is much more effective that proximity capping at preventing growth surface decomposition at high temperature annealing. The table below indicates that in the comparison of two different annealed samples, one using TMAs overpressure and the other Si proximity capping, while both annealing conditions did generate some surface deterioration, the TMAs annealed surface is slightly better in terms having gained less oxygen and loss and having lost less arsenic. This is also demonstrated in the Auger profile of a TMAs annealed sample shown in FIG. 5.

| sample | annealing conditions | O gained in surface oxide ($10^{15}$ atoms/cm$^2$) | As lost from bulk to ambient or into surface oxide ($10^{15}$ atoms/cm$^2$) |
|---|---|---|---|
| I | as implanted unannealed | 05.1 | 2.5 |
| 349I | 10 sec @ 830° C. TMAs | 12.1 | 7.8 |
| 343I | 10 sec @ 830° C. Si prox. cap | 15.7 | 8.7 |

Figure 6:
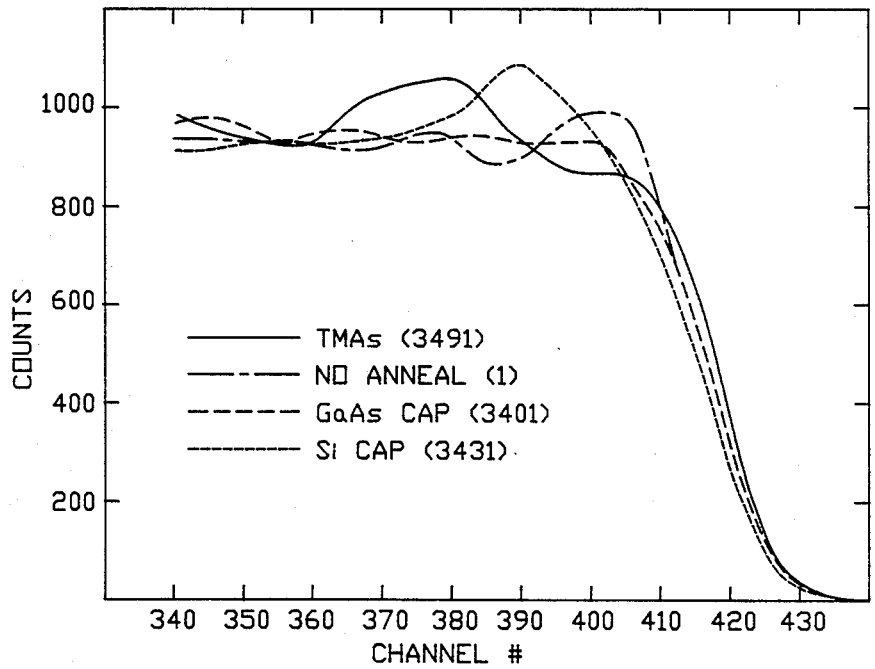
FIG. 6 is a Rutherford back scattering (RBS) spectra for four different samples, illustrating the shift in position of the surface edge depending on the annealing conditions imposed.

Finally, FIG. 6 is a set of Rutherford back-scattering spectra for four different samples. The interesting portions of the spectra are the right-hand edges which fall at slightly different channel numbers, depending on the anneal condition. A higher channel number indicates a more massive element at the surface. Not unexpectedly, the TMAs annealed sample has highest arsenic concentration at the Ga/As surface. The difference is small, but variations of 3 or 4 in the RBS channel number are usually significant.

In summary, this inventive method provides a TMAs ambient rapid thermal annealer that maintains an As overpressure in a rapidly heated wall reactor. Using this method, short anneals in arsenic appear to be as effective as long ones for activating implants, so that the added thermal exposure of an arsine furnace may be unnecessary. The TMAs ambient also appears highly beneficial in increasing activation of Si implants, yielding less surface decomposition than proximity capping.

Alternatives to the specific embodiment of this invention may become apparent to a person of skill in the art who studies this invention disclosure. GaAs can be implanted with dopants other than Si for device fabrication. The tests herein were run only on Si, but the annealing method may well enhance activation of other dopants as well. Also, GaAs is one of several III/V compound semiconductors used for device fabrication. Although the tests herein studied only GaAs, the annealing method may well work for other such semiconductors, e.g., phosphorous overpressure for GaP or InP.

Therefore, the scope of this invention is to be limited only by the following claims.

What is claimed is:

1. A method of rapid thermal annealing of a silicon implanted Ga/As wafer comprising the steps of
   locating and supporting the Ga/As wafer within an annealing chamber,
   introducing arsenic from a gas source into said furnace in the region surrounding wafer,
   heating the walls of said annealing chamber more rapidly than said wafer to create a wall temperature higher than the condensation point of said arsenic, preventing arsenic condensation on the walls,
   annealing said wafer in said arsenic atmosphere to achieve a high activation efficiency.

2. A method as in claim 1 wherein said annealing step is carried out for about 10 seconds.

3. A method as in claim 1 wherein said arsenic is introduced by flowing trimethylarsenic at appropriate overpressure into said chamber prior to said heating step.

4. A method as in claim 1 wherein the walls of the chamber are heated to about 500° to 600° C. during said annealing step.

5. A method as in claim 1 wherein the rise time for heating the walls of said chamber to 500° to 600° C. is about 10 seconds or less.

6. A method of rapid thermal annealing of Si implanted Ga/As wafer comprising the steps of
   locating and supporting the Ga/As wafer within an annealing chamber,
   introducing arsenic into said furnace by flowing trimethylarsenic at overpressure into said furnace,
   heating the walls of said chamber more rapidly than said wafer is heated to about 500° to 600° C. to create a wall temperature higher than the condensation point of said arsenic, preventing arsenic condensation on the walls,
   annealing said wafer in said arsenic atmosphere for about 10 seconds to achieve a high activation efficiency.

7. A method as in claim 6 wherein the walls of the chamber are heated to about 500° to 600° C. during said annealing step.

8. A method as in claim 6 wherein said wall is molybdenum.

9. A method of rapid thermal annealing of a silicon implanted GaD or InP wafer comprising the steps of
   locating and supporting the Ga/As wafer within an annealing chamber,
   introducing phosphorous from a gas source into said furnace in the region surrounding wafer,
   heating the walls of said annealing chamber more rapidly than said wafer to create a wall temperature higher than the condensation point of said phosphorous, preventing phosphorous condensation on the walls,
   annealing said wafer in said phosphorous atmosphere to achieve a high activation efficiency.

* * * * *